(12) United States Patent
Ding et al.

(10) Patent No.: US 10,861,919 B2
(45) Date of Patent: Dec. 8, 2020

(54) OLED DISPLAY PANEL AND METHOD FOR MANUFACTURING SAME

(71) Applicant: Wuhan China Star Optoelectronics Semiconductor Display Technology Co., Ltd., Wuhan (CN)

(72) Inventors: Wu Ding, Wuhan (CN); Songshan Li, Wuhan (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 67 days.

(21) Appl. No.: 16/319,474

(22) PCT Filed: Jan. 11, 2019

(86) PCT No.: PCT/CN2019/071321
§ 371 (c)(1),
(2) Date: Jan. 22, 2019

(87) PCT Pub. No.: WO2020/098143
PCT Pub. Date: May 22, 2020

(65) Prior Publication Data
US 2020/0185479 A1    Jun. 11, 2020

(30) Foreign Application Priority Data

Nov. 13, 2018    (CN) .......................... 2018 1 1343328

(51) Int. Cl.
*H01L 27/32*    (2006.01)
*H01L 51/52*    (2006.01)
(Continued)

(52) U.S. Cl.
CPC ...... *H01L 27/3262* (2013.01); *H01L 27/3246* (2013.01); *H01L 27/3265* (2013.01);
(Continued)

(58) Field of Classification Search
CPC ............ H01L 27/3262; H01L 27/3246; H01L 27/3265; H01L 51/529; H01L 51/56;
(Continued)

(56) References Cited

U.S. PATENT DOCUMENTS

| | | | |
|---|---|---|---|
| 2007/0085090 A1* | 4/2007 | Kim | ...................... G02F 1/1362 257/83 |
| 2007/0278480 A1* | 12/2007 | Hwang | ............... H01L 27/1255 257/40 |
| 2015/0270324 A1 | 9/2015 | Yoneya | |
| 2016/0043212 A1* | 2/2016 | Gao | .................. H01L 29/66757 257/71 |

(Continued)

FOREIGN PATENT DOCUMENTS

| CN | 104078621 | 10/2014 |
|---|---|---|
| CN | 104488104 | 4/2015 |

(Continued)

*Primary Examiner* — Mohammed R Alam

(57) ABSTRACT

The present disclosure provides an organic light emitting diode (OLED) display panel and a method for manufacturing same. The OLED display panel includes a substrate, a thermal insulating layer, a buffer, a driving TFT, and a storage capacitor. The substrate includes an arrangement area. The thermal insulating layer is disposed in the arrangement area. The buffer layer is disposed on the substrate. Both the driving TFT and the storage capacitor are disposed on the buffer layer to correspond to the arrangement area. According to the present disclosure, the thermal insulating layer prevents heat in the amorphous silicon layer from dissipating rapidly when an annealing treatment is performed for the amorphous silicon layer to have amorphous silicon crystallize.

13 Claims, 4 Drawing Sheets

(51) Int. Cl.
*H01L 51/56* (2006.01)
*H01L 27/12* (2006.01)

(52) U.S. Cl.
CPC ............ *H01L 51/529* (2013.01); *H01L 51/56* (2013.01); *H01L 27/1218* (2013.01); *H01L 27/1222* (2013.01); *H01L 27/1255* (2013.01); *H01L 27/1262* (2013.01); *H01L 27/1274* (2013.01); *H01L 2227/323* (2013.01)

(58) Field of Classification Search
CPC ............ H01L 27/1218; H01L 27/1222; H01L 27/1255; H01L 27/1262; H01L 27/1274; H01L 2227/323; H01L 27/1248; H01L 27/3244; H01L 51/0026; H01L 51/52; H01L 2251/53
See application file for complete search history.

(56) References Cited

U.S. PATENT DOCUMENTS

| | | |
|---|---|---|
| 2016/0307985 A1 | 10/2016 | Beak et al. |
| 2017/0104048 A1* | 4/2017 | Chung ................ H01L 27/3262 |
| 2017/0278869 A1 | 9/2017 | Hiramatsu et al. |
| 2018/0033849 A1 | 2/2018 | Noh et al. |
| 2018/0047830 A1 | 2/2018 | Lu |
| 2018/0240855 A1 | 8/2018 | Lee et al. |

FOREIGN PATENT DOCUMENTS

| | | |
|---|---|---|
| CN | 104752637 | 7/2015 |
| CN | 105374882 | 3/2016 |
| CN | 106548980 | 3/2017 |
| CN | 107591410 | 1/2018 |
| CN | 107665909 | 2/2018 |

* cited by examiner

OLED DISPLAY PANEL AND METHOD FOR MANUFACTURING SAME

RELATED APPLICATIONS

This application is a National Phase of PCT Patent Application No. PCT/CN2019/071321 having International filing date of Jan. 11, 2019, which claims the benefit of priority of Chinese Patent Application No. 201811343328.8 filed on Nov. 13, 2018. The contents of the above applications are all incorporated by reference as if fully set forth herein in their entirety.

FIELD AND BACKGROUND OF THE INVENTION

The present disclosure relates to a field of display technology, and more particularly to an organic light emitting diode (OLED) display panel and a method for manufacturing same.

In conventional methods for forming low temperature polycrystalline silicon thin film transistors (LTPS-TFTs), a buffer layer of three-layered structure that includes a $SiN_x$ film, a $SiO_x$ film, and an amorphous silicon (a-Si) film is first deposited on a substrate, then an excimer laser annealing (ELA) treatment is performed for a-Si film to have a-Si film crystallize to form LTPS. However, sizes of LTPS grains formed according to the conventional methods have poor uniformity, and there are too many grain boundaries between LTPS grains. This results in poor uniformity of electrical properties between switch TFTs and driving TFTs. In particular, uniformity of electrical properties of driving TFTs is severely influenced. Manufacturing yield of LTPS is severely influenced as well because driving TFTs directly affect light-emitting characteristics of organic light emitting diode (OLED) devices.

SUMMARY OF THE INVENTION

The present disclosure provides an organic light emitting diode (OLED) display panel and a method for manufacturing same in order to solve the problems encountered by the prior art, where uniformity of sizes of LTPS grains in LTPS-TFTs is poor, there are too many grain boundaries between LTPS grains, and uniformity of electrical properties of driving TFTs is poor.

To solve the aforementioned problems, the present disclosure provides an organic light emitting diode (OLED) display panel, comprising:

a substrate including an arrangement area, wherein a driving thin film transistor (TFT) for driving an OLED device to emit light and a storage capacitor corresponding to the driving TFT are disposed in the arrangement area;

a thermal insulating layer including at least one thermal insulating sublayer disposed in the arrangement area;

a buffer layer disposed on the substrate and covering the thermal insulating layer;

the driving TFT disposed on the buffer layer to correspond to the arrangement area; and the storage capacitor disposed on the buffer layer to correspond to the arrangement area;

wherein both the driving TFT and the storage capacitor include a polysilicon layer disposed on the buffer layer, the thermal insulating layer is configured to enhance, when amorphous silicon crystallizes to form the polysilicon layer, heat stability in the amorphous silicon;

wherein the thermal insulating layer includes a first thermal insulating sublayer disposed on the substrate and a second thermal insulating sublayer disposed on the first thermal insulating sublayer, the first thermal insulating sublayer is made of a material different from that of the second thermal insulating sublayer; and wherein the thermal insulating layer has a thickness ranging from 50 micrometers to 100 micrometers.

In the OLED display panel of the present disclosure, the buffer layer includes a first buffer sublayer covering the second thermal insulating sublayer and a second buffer sublayer disposed on the first buffer sublayer, the first buffer sublayer is made of $SiN_x$, the first thermal insulating sublayer is made of $SiO_x$, and the second thermal insulating sublayer is made of $SiO_xN_y$.

In the OLED display panel of the present disclosure, in the second thermal insulating sublayer, oxygen has a quantity greater than that of nitrogen.

In the OLED display panel of the present disclosure, the thermal insulating layer is made of $SiO_x$, $SiO_xN_y$, or a combination thereof.

In the OLED display panel of the present disclosure, the OLED display panel further comprises a switch TFT functioning as a switch, the thermal insulating layer is disposed on the substrate to correspond to the switch TFT.

In addition, the present disclosure provides an organic light-emitting diode (OLED) display panel, comprising:

a substrate including an arrangement area, wherein a driving thin film transistor (TFT) for driving an OLED device to emit light and a storage capacitor corresponding to the driving TFT are disposed in the arrangement area;

a thermal insulating layer including at least one thermal insulating sublayer disposed in the arrangement area;

a buffer layer disposed on the substrate and covering the thermal insulating layer;

the driving TFT disposed on the buffer layer to correspond to the arrangement area; and the storage capacitor disposed on the buffer layer to correspond to the arrangement area;

wherein both the driving TFT and the storage capacitor include a polysilicon layer disposed on the buffer layer, the thermal insulating layer is configured to enhance, when amorphous silicon crystallizes to form the polysilicon layer, heat stability in the amorphous silicon.

In the first embodiment of the OLED display panel of the present disclosure, the thermal insulating layer is consisted of a single thermal insulating sublayer.

In the second embodiment of the OLED display panel of the present disclosure, the thermal insulating layer includes a first thermal insulating sublayer disposed on the substrate and a second thermal insulating sublayer disposed on the first thermal insulating sublayer, the first thermal insulating sublayer is made of a material different from that of the second thermal insulating sublayer.

In the second embodiment of the OLED display panel of the present disclosure, the buffer layer includes a first buffer sublayer covering the second thermal insulating sublayer and a second buffer sublayer disposed on the first buffer sublayer, the first buffer sublayer is made of $SiN_x$, the first thermal insulating sublayer is made of $SiO_x$, and the second thermal insulating sublayer is made of $SiO_xN_y$.

In the second embodiment of the OLED display panel of the present disclosure, in the second thermal insulating sublayer, oxygen has a quantity greater than that of nitrogen.

In the third embodiment of the OLED display panel of the present disclosure, the OLED display panel further comprises a switch TFT functioning as a switch, the thermal insulating layer is disposed on the substrate to correspond to the switch TFT.

In the OLED display panel of the present disclosure, the thermal insulating layer has a thickness ranging from 50 micrometers to 100 micrometers.

In the OLED display panel of the present disclosure, the thermal insulating layer is made of $SiO_x$, $SiO_xN_y$, or a combination thereof.

Moreover, the present disclosure provides a method for manufacturing an organic light emitting diode (OLED) display panel, comprising:

a step S1 of providing a substrate, wherein the substrate includes an arrangement area, and a driving thin film transistor (TFT) for driving an OLED device to emit light and a storage capacitor corresponding to the driving TFT are disposed in the arrangement area;

a step S2 of forming a thermal insulating layer in the arrangement area of the substrate, wherein the thermal insulating layer is configured to prevent heat in amorphous silicon from dissipating rapidly when amorphous silicon crystallizes;

a step S3 of sequentially forming a buffer layer and an amorphous silicon layer on the substrate;

a step S4 of performing an excimer laser annealing (ELA) treatment for the amorphous silicon layer to have the amorphous silicon layer form a polysilicon layer, and patterning the polysilicon layer;

a step S5 of sequentially forming an insulation layer, a gate metal layer, an interlayer dielectric layer, a source/drain metal layer, and a passivation on the polysilicon layer, so as to form the driving TFT and the storage capacitor; and a step S6 of sequentially forming a planarization layer, an anode, a pixel defining layer, and a separation portion on the passivation layer.

In the method for manufacturing the OLED display panel of the present disclosure, the step S2 comprises:

a step S21 of depositing a $SiO_x$ film on the substrate using a plasma enhanced chemical vapor deposition (PECVD) technique, and forming the first thermal insulating sublayer using a photolithography technique; and a step S22 of depositing a $SiO_xN_y$ film on the first thermal insulating sublayer using the PECVD technique, and forming the second thermal insulating sublayer using the photolithography technique.

In the method for manufacturing the OLED display panel of the present disclosure, a reaction condition in the step S21 of depositing the $SiO_x$ film is controlled to have a temperature of 400° C.-440° C., an energy of 10 KW-20 KW, a pressure of 40 Pa-80 Pa, a flow ratio of $SiH_4:N_2O$ ranging from 1:100 to 1:50, and a reaction time of 20 sec-40 sec; and a reaction condition in the step S22 of depositing the $SiO_xN_y$ film is controlled to have a temperature of 400° C.-440° C., an energy of 10 KW-20 KW, a pressure of 40 Pa-80 Pa, a flow ratio of $SiH_4:N_2O:NH_3$ ranging from 1:100:80 to 1:100:120, and a reaction time of 20 sec-40 sec.

In the method for manufacturing the OLED display panel of the present disclosure, in the second thermal insulating sublayer, oxygen has a quantity greater than that of nitrogen.

In the method for manufacturing the OLED display panel of the present disclosure, the thermal insulating layer has a thickness ranging from 50 micrometers to 100 micrometers.

Compared to conventional OLED display panel and conventional method for manufacturing same, the present disclosure provides an OLED display panel and a method for manufacturing same. By disposing the thermal insulating layer in the arrangement area of the substrate, the present disclosure prevents heat in the amorphous silicon layer from dissipating rapidly when an annealing treatment is performed for the amorphous silicon layer to have amorphous silicon crystallize. This makes the amorphous silicon layer completely crystallize to form the polysilicon layer of the driving TFTs and the storage capacitors. Thus, the present disclosure increases sizes of grains, and increases uniformity of grain sizes. Uniformity of electrical properties of driving TFTs is increased as well, improving light emission uniformity of OLED devices. Therefore, the present disclosure solves the problems encountered by the prior art, where uniformity of sizes of LTPS grains in LTPS-TFTs is poor, there are too many grain boundaries between LTPS grains, and uniformity of electrical properties of driving TFTs is poor.

DESCRIPTION OF SPECIFIC EMBODIMENTS OF THE INVENTION

Please refer to the accompanying drawings, where the same reference symbol represents the same components. The following description is provided based on the illustrated embodiments, which do not limit other embodiments that are not provided herein.

Figure 1:
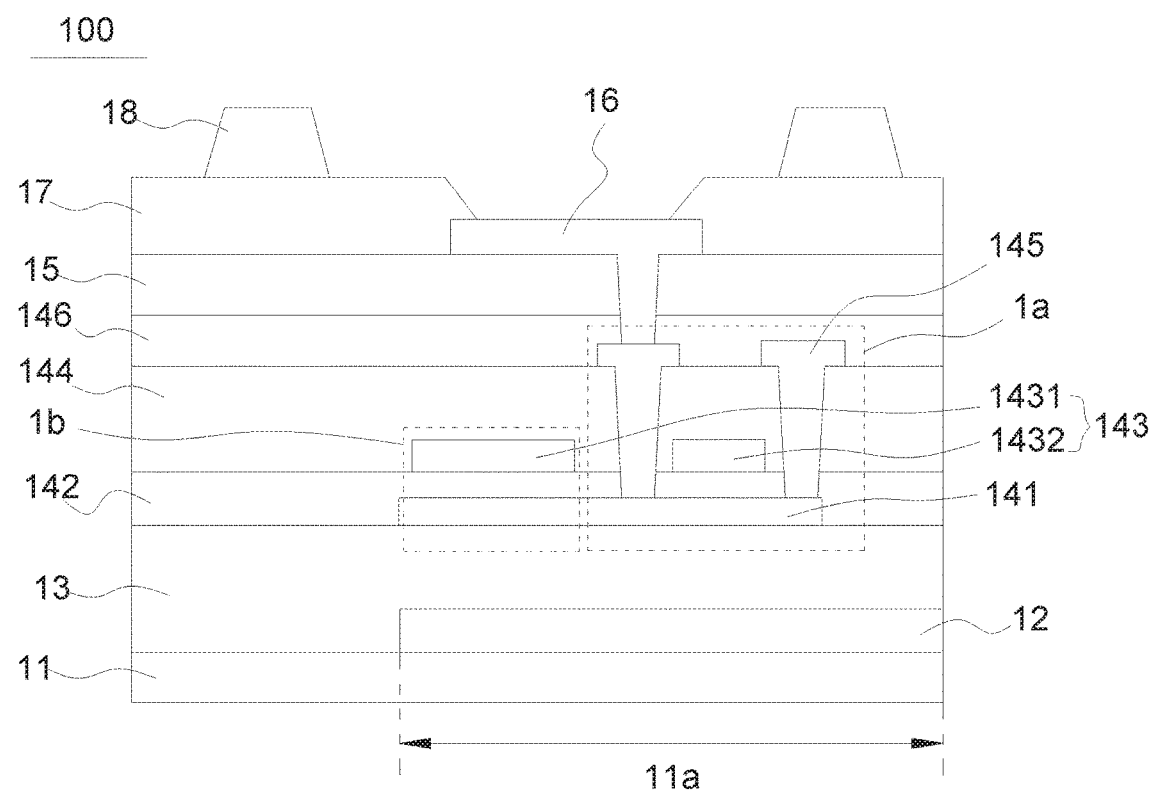
FIG. 1 is a cross-sectional view of a structure of an OLED display panel according to a first embodiment of the present disclosure.

Please see FIG. 1, which is a cross-sectional view of a structure of an OLED display panel according to a first embodiment of the present disclosure. According to the first embodiment of the present disclosure, the organic light emitting diode (OLED) display panel 100 includes a substrate 11, a thermal insulating layer 12, a buffer layer 13, a driving TFT (thin film transistor) 1a, a storage capacitor 1b, a planarization layer 15, an anode 16, a pixel defining layer 17, and a separation portion 18.

The substrate 11 includes an arrangement area 11a, wherein the driving TFT 1a for driving an OLED device to emit light and the storage capacitor 1b corresponding to the driving TFT 1a are disposed in the arrangement area 11a. The thermal insulating layer 12 includes at least one thermal insulating sublayer disposed in the arrangement area 11a. The buffer layer 13 is disposed on the substrate 11, and covers the thermal insulating layer 12. The driving TFT 1a is disposed on the buffer layer 13 to correspond to the arrangement area 11a, and the storage capacitor 1b is disposed on the buffer layer 13 to correspond to the arrangement area 11a.

Both the driving TFT 1a and the storage capacitor 1b include a polysilicon layer 141 disposed on the buffer layer 13. The thermal insulating layer 12 is configured to enhance heat stability in amorphous silicon when amorphous silicon crystallizes to form the polysilicon layer 141.

In the first embodiment of the present disclosure, the thermal insulating layer 12 is disposed in the arrangement area 11a of the substrate 11, in order to prevent heat in the amorphous silicon layer from dissipating rapidly when an annealing treatment is performed for the amorphous silicon layer to have amorphous silicon crystallize. Thus, the amorphous silicon layer could completely crystallize to form the polysilicon layer 141 of the driving TFT 1a and the storage capacitor 1b. This not only increases sizes of grains, but increases uniformity of grain sizes. Therefore, uniformity of electrical properties of driving TFTs 1a is increased, improving light emission uniformity of OLED devices.

In the first embodiment of the present disclosure, the OLED display panel 100 includes the polysilicon layer 141 disposed on the buffer layer 13, an insulation layer 142 disposed on the polysilicon layer 141, a gate metal layer 143 disposed on the insulation layer 142, an interlayer dielectric layer 144 disposed on the gate metal layer 143, a source/drain metal layer 145 disposed on the interlayer dielectric layer 144, a passivation layer 146 disposed on the source/drain metal layer 145, and the planarization layer 15 disposed on the passivation layer 146. In addition, the OLED display panel 100 further includes the anode 16, the pixel defining layer 17, and the separation portion 18 sequentially disposed on the planarization layer 15.

The polysilicon layer 141 includes an active layer of the driving TFT 1a and a lower electrode plate of the storage capacitor 1b. The lower electrode plate is formed by performing ion implantation into the polysilicon layer 141. The gate metal layer includes an upper electrode plate 1431 corresponding to the lower electrode plate and a gate electrode 1432 of the driving TFT 1a.

Thus, the active layer, the gate electrode 1432, and the source/drain electrode of the source/drain metal layer 145 constitute the driving TFT 1a. The upper electrode plate 1431 and the lower electrode plate 1432 constitute the storage capacitor 1b.

In the first embodiment, the thermal insulating layer 12 is consisted of a single thermal insulating sublayer. The thermal insulating layer 12 has a thickness ranging from 50 micrometers to 100 micrometers. Such configuration can ensure that the thermal insulating layer 12 maintains temperature, and stress difference between the thermal insulating layer 12 and adjacent layers adhered thereto is not influenced. Thus, joining stability between the thermal insulating layer 12 and adjacent layers adhered thereto is raised.

Optionally, the thermal insulating layer 12 is made of $SiO_x$, $SiO_xN_y$, or a combination thereof, wherein x and y represents number, such as 1, 2, or etc.

To form the polysilicon layer 141 of the first embodiment, a $SiO_x$ film is deposited on the substrate 11 first. (As an example, the thermal insulating layer 12 in the first embodiment is made of $SiO_x$.) Next, a thermal insulating layer 12 is formed in the arrangement area 11a using the photolithography technique. Thereafter, a buffer layer 13 and an amorphous silicon layer are sequentially formed on the thermal insulating layer 12. Finally, an excimer laser annealing (ELA) treatment is performed for the amorphous silicon layer to have the amorphous silicon layer crystallize to from the polysilicon layer 141.

During crystallization of the amorphous silicon layer, the thermal insulating layer 12 functions to prevent heat in the amorphous silicon layer from dissipating rapidly. Therefore, the amorphous silicon layer, to which the thermal insulating layer 12 corresponds, can completely crystallize to form the polysilicon layer. This increases uniformity of grain sizes, and further increases uniformity of electrical properties of driving TFTs.

Figure 2:
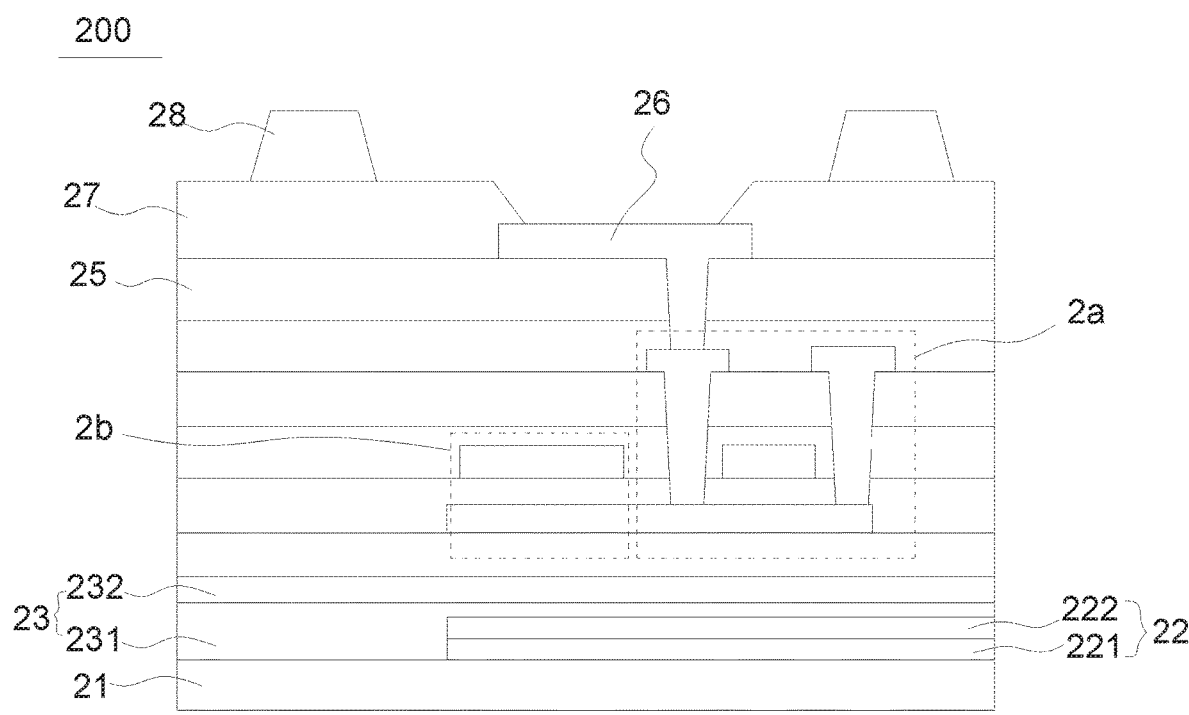
FIG. 2 is a cross-sectional view of a structure of an OLED display panel according to a second embodiment of the present disclosure.

Please refer to FIG. 2, which is a cross-sectional view of a structure of an OLED display panel according to a second embodiment of the present disclosure. According to the second embodiment of the present disclosure, the organic light emitting diode (OLED) display panel 200 includes a substrate 21, a thermal insulating layer 22, a buffer layer 23, a driving TFT 2a, a storage capacitor 2b, a planarization layer 25, an anode 26, a pixel defining layer 27, and a separation portion 28. The second embodiment differs from the first embodiment in those described below.

The thermal insulating layer 22 includes a first thermal insulating sublayer 221 disposed on the substrate 21 and a second thermal insulating sublayer 222 disposed on the first thermal insulating sublayer 221. The first thermal insulating sublayer 221 is made of a material different from that of the second thermal insulating sublayer 222.

The buffer layer 23 includes a first buffer sublayer 231 covering the second thermal insulating sublayer 222 and a second buffer sublayer 232 disposed on the first buffer sublayer 231. The first buffer sublayer 231 is made of $SiN_x$, the second buffer sublayer 232 is made of $SiO_x$, the first thermal insulating sublayer 221 is made of $SiO_x$, and the second thermal insulating sublayer 222 is made of $SiO_xN_y$.

The second thermal insulating sublayer 222 is sandwiched between the first thermal insulating sublayer 221 and the first buffer sublayer 231, thus raising the joining stability between the thermal insulating layer 22 and the buffer layer 23. Specifically, stress difference between the first buffer sublayer 231 and the first thermal insulating sublayer 221 is large. The second thermal insulating sublayer 222 has a value of stress between that of the first buffer sublayer 231 and that of the first thermal insulating sublayer 221, and thus the second thermal insulating sublayer 222 functions as a transition body.

Moreover, in the second thermal insulating sublayer 222, oxygen has a quantity greater than that of nitrogen. Such design raises adhering ability of the second thermal insulating sublayer 222 to organic/inorganic layers, thus raising the joining stability between the thermal insulating layer 22 and the buffer layer 23.

The second thermal insulating sublayer 222 is formed using a plasma enhanced chemical vapor deposition (PECVD) technique, where quantity of oxygen and nitrogen contained in the second thermal insulating sublayer 222 could be controlled by adjusting ratio of film formation gases and applied energy.

Figure 3:
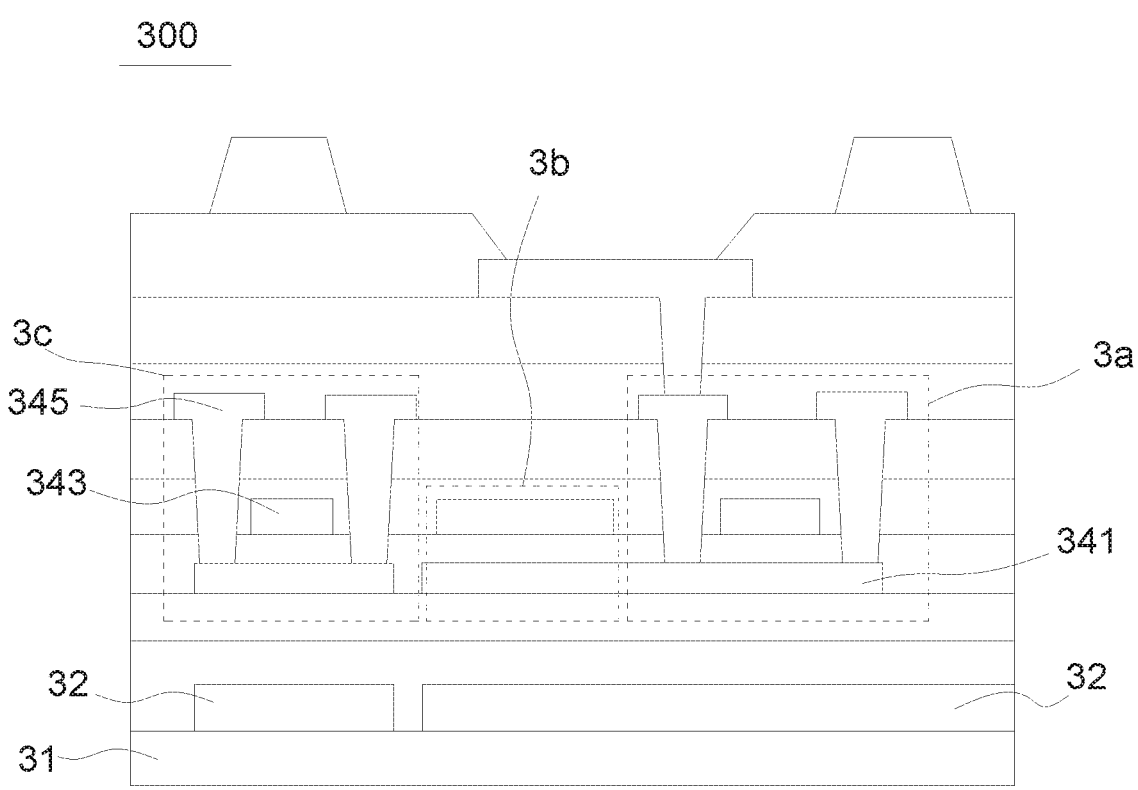
FIG. 3 is a cross-sectional view of a structure of an OLED display panel according to a third embodiment of the present disclosure.

Please refer to FIG. 3, which is a cross-sectional view of a structure of an OLED display panel according to a third embodiment of the present disclosure. The third embodiment differs from the first embodiment in those described below.

The OLED display panel 300 further includes a switch TFT 3c functioning as a switch. The thermal insulating layer 32 is disposed on the substrate 31 to correspond to the switch TFT 3c. By disposing the thermal insulating layer 32 directly under all of the driving TFT 3a, the storage capacitor 3b, and the switch TFT 3c, uniformity of sizes of crystallized grains in the polysilicon layer 341 is increased. Therefore, uniformity of electrical properties of driving TFTs 3a and switch TFTs 3c is increased, improving light emission uniformity of OLED devices.

The switch TFT 3c includes an active layer constituting the polysilicon layer 341, a gate electrode of the gate metal layer 343, and a source/drain electrode of the source/drain metal layer 345.

Figure 4:
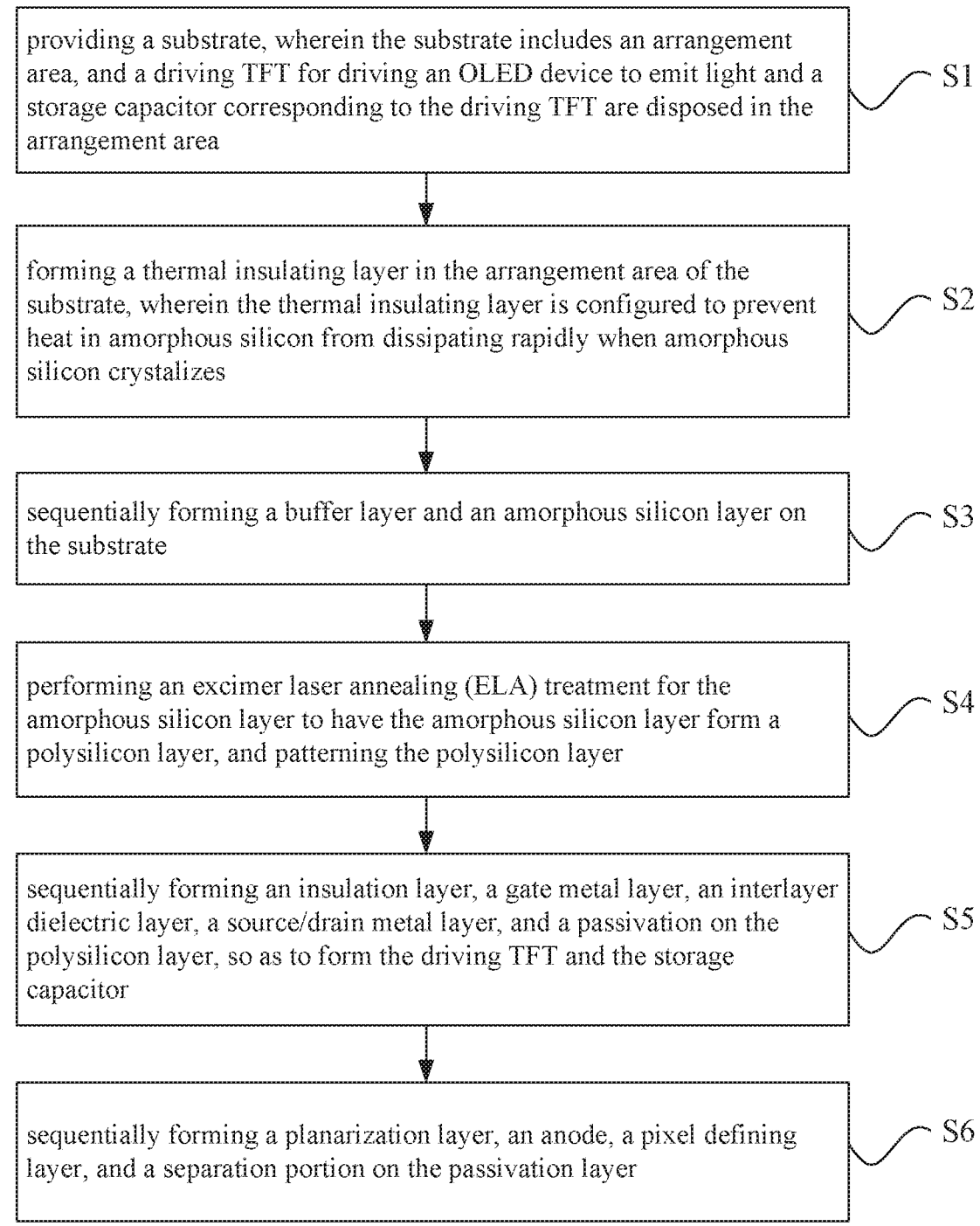
FIG. 4 shows a flowchart of a method for manufacturing an OLED display panel according to one embodiment of the present disclosure.

As shown in FIG. 4, the present disclosure further provides a method for manufacturing an organic light emitting diode (OLED) display panel, which includes:

a step S1 of providing a substrate, wherein the substrate includes an arrangement area, and a driving TFT for driving an OLED device to emit light and a storage capacitor corresponding to the driving TFT are disposed in the arrangement area;

a step S2 of forming a thermal insulating layer in the arrangement area of the substrate, wherein the thermal insulating layer is configured to prevent heat in amorphous silicon from dissipating rapidly when amorphous silicon crystallizes;

a step S3 of sequentially forming a buffer layer and an amorphous silicon layer on the substrate;

a step S4 of performing an excimer laser annealing (ELA) treatment for the amorphous silicon layer to have the amorphous silicon layer form a polysilicon layer, and patterning the polysilicon layer;

a step S5 of sequentially forming an insulation layer, a gate metal layer, an interlayer dielectric layer, a source/drain metal layer, and a passivation on the polysilicon layer, so as to form the driving TFT and the storage capacitor; and a step S6 of sequentially forming a planarization layer, an anode, a pixel defining layer, and a separation portion on the passivation layer.

Figure 5:
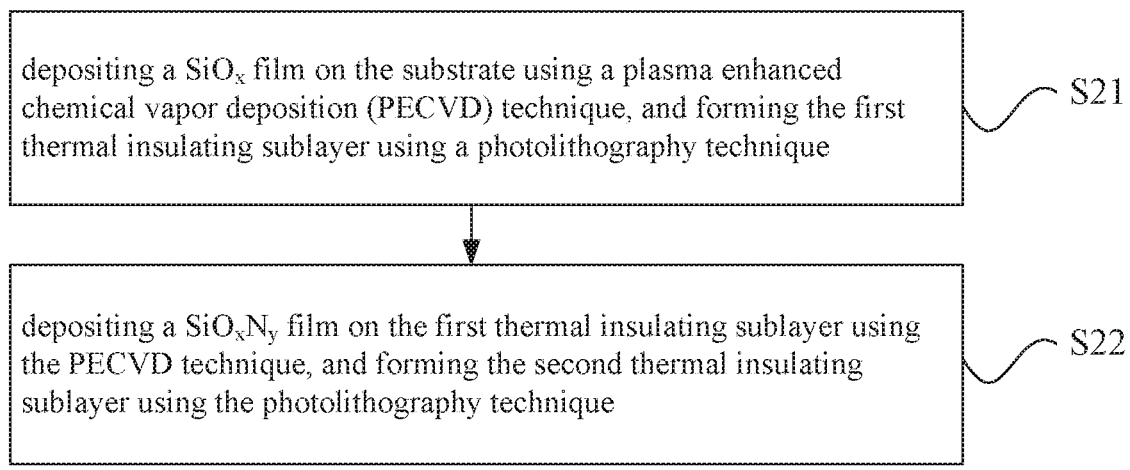
FIG. 5 shows a flowchart of a S2 in a method for manufacturing an OLED display panel according to one embodiment of the present disclosure.

As shown in FIG. 5, in the method for manufacturing an OLED display panel according to the present embodiment, the step S2 includes:

a step S21 of depositing a $SiO_x$ film on the substrate using a plasma enhanced chemical vapor deposition (PECVD) technique, and forming the first thermal insulating sublayer using a photolithography technique; and a step S22 of depositing a $SiO_xN_y$ film on the first thermal insulating sublayer using the PECVD technique, and forming the second thermal insulating sublayer using the photolithography technique.

In the method for manufacturing an OLED display panel according to the present embodiment, a reaction condition in the step S21 of depositing the $SiO_x$ film is controlled to have a temperature of 400° C.-440° C., an energy of 10 KW-20 KW, a pressure of 40 Pa-80 Pa, a flow ratio of $SiH_4$:$N_2O$ ranging from 1:100 to 1:50, and a reaction time of 20 sec-40 sec.

A reaction condition in the step S22 of depositing the $SiO_xN_y$ film is controlled to have a temperature of 400° C.-440° C., an energy of 10 KW-20 KW, a pressure of 40 Pa-80 Pa, a flow ratio of $SiH_4$:$N_2O$:$NH_3$ ranging from 1:100:80 to 1:100:120, and a reaction time of 20 sec-40 sec.

In the method for manufacturing an OLED display panel according to the present embodiment, in the second thermal insulating sublayer, oxygen has a quantity greater than that of nitrogen.

In the method for manufacturing an OLED display panel according to the present embodiment, the thermal insulating layer has a thickness ranging from 50 micrometers to 100 micrometers.

Compared to conventional OLED display panel and conventional method for manufacturing same, the present disclosure provides an OLED display panel and a method for manufacturing same. By disposing the thermal insulating layer in the arrangement area of the substrate, the present disclosure prevents heat in the amorphous silicon layer from dissipating rapidly when an annealing treatment is performed for the amorphous silicon layer to have amorphous silicon crystallize. This makes the amorphous silicon layer completely crystallize to form the polysilicon layer of the driving TFTs and the storage capacitors. Thus, the present disclosure increases sizes of grains, and increases uniformity of grain sizes. Uniformity of electrical properties of driving TFTs is increased as well, improving light emission uniformity of OLED devices. Therefore, the present disclosure solves the problems encountered by the prior art, where uniformity of sizes of LTPS grains in LTPS-TFTs is poor, there are too many grain boundaries between LTPS grains, and uniformity of electrical properties of driving TFTs is poor.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. An organic light emitting diode (OLED) display panel, comprising: a substrate including an arrangement area, wherein a driving thin film transistor (TFT) for driving an OLED device to emit light and a storage capacitor corresponding to the driving TFT are disposed in the arrangement area; a thermal insulating layer including at least one thermal insulating sublayer disposed in the arrangement area; a buffer layer disposed on the substrate and covering the thermal insulating layer; the driving TFT disposed on the buffer layer to correspond to the arrangement area; and the storage capacitor disposed on the buffer layer to correspond to the arrangement area; wherein both the driving TFT and the storage capacitor include a polysilicon layer disposed on the buffer layer, the thermal insulating layer is configured to enhance, when amorphous silicon crystallizes to form the polysilicon layer, heat stability in the amorphous silicon; wherein the thermal insulating layer includes a first thermal insulating sublayer disposed on the substrate and a second thermal insulating sublayer disposed on the first thermal insulating sublayer, the first thermal insulating sublayer is made of a material different from that of the second thermal insulating sublayer; wherein the thermal insulating layer has a thickness ranging from 50 micrometers to 100 micrometers; and wherein the buffer layer includes a first buffer sublayer covering the second thermal insulating sublayer and a second buffer sublayer disposed on the first buffer sublayer, the first buffer sublayer is made of SiNx, the first thermal insulating sublayer is made of SiOx, and the second thermal insulating sublayer is made of SiOxNy.

2. The OLED display panel according to claim 1, wherein in the second thermal insulating sublayer, oxygen has a quantity greater than that of nitrogen.

3. The OLED display panel according to claim 1, wherein the thermal insulating layer is made of $SiO_x$, $SiO_xN_y$, or a combination thereof.

4. The OLED display panel according to claim 1, wherein the OLED display panel further comprises a switch TFT functioning as a switch, the thermal insulating layer is disposed on the substrate to correspond to the switch TFT.

5. An organic light-emitting diode (OLED) display panel, comprising: a substrate including an arrangement area, wherein a driving thin film transistor (TFT) for driving an OLED device to emit light and a storage capacitor corresponding to the driving TFT are disposed in the arrangement area; a thermal insulating layer including at least one thermal insulating sublayer disposed in the arrangement area; a buffer layer disposed on the substrate and covering the thermal insulating layer; the driving TFT disposed on the buffer layer to correspond to the arrangement area; and the storage capacitor disposed on the buffer layer to correspond to the arrangement area; wherein both the driving TFT and the storage capacitor include a polysilicon layer disposed on the buffer layer, the thermal insulating layer is configured to enhance, when amorphous silicon crystallizes to form the polysilicon layer, heat stability in the amorphous silicon; wherein the thermal insulating layer includes a first thermal insulating sublayer disposed on the substrate and a second thermal insulating sublayer disposed on the first thermal insulating sublayer, the first thermal insulating sublayer is made of a material different from that of the second thermal insulating sublayer; and wherein the buffer layer includes a first buffer sublayer covering the second thermal insulating sublayer and a second buffer sublayer disposed on the first buffer sublayer, the first buffer sublayer is made of SiNx, the first thermal insulating sublayer is made of SiOx, and the second thermal insulating sublayer is made of SiOxNy.

6. The OLED display panel according to claim 5, wherein in the second thermal insulating sublayer, oxygen has a quantity greater than that of nitrogen.

7. The OLED display panel according to claim 5, wherein the thermal insulating layer has a thickness ranging from 50 micrometers to 100 micrometers.

8. The OLED display panel according to claim 5, wherein the thermal insulating layer is made of $SiO_x$, $SiO_xN_y$, or a combination thereof.

9. The OLED display panel according to claim 5, wherein the OLED display panel further comprises a switch TFT functioning as a switch, the thermal insulating layer is disposed on the substrate to correspond to the switch TFT.

10. A method for manufacturing an organic light emitting diode (OLED) display panel, comprising: a step S1 of providing a substrate, wherein the substrate includes an arrangement area, and a driving thin film transistor (TFT) for driving an OLED device to emit light and a storage capacitor corresponding to the driving TFT are disposed in the arrangement area; a step S2 of forming a thermal insulating layer in the arrangement area of the substrate, wherein the thermal insulating layer is configured to prevent heat in amorphous silicon from dissipating rapidly when amorphous silicon crystallizes; a step S3 of sequentially forming a buffer layer and an amorphous silicon layer on the substrate; a step S4 of performing an excimer laser annealing (ELA) treatment for the amorphous silicon layer to have the amorphous silicon layer form a polysilicon layer, and patterning the polysilicon layer; a step S5 of sequentially forming an insulation layer, a gate metal layer, an interlayer dielectric layer, a source/drain metal layer, and a passivation on the polysilicon layer, so as to form the driving TFT and the storage capacitor; a step S6 of sequentially forming a planarization layer, an anode, a pixel defining layer, and a separation portion on the passivation layer; and wherein the step S2 comprises: a step S21 of depositing a SiOx film on the substrate using a plasma enhanced chemical vapor deposition (PECVD) technique, and forming a first thermal insulating sublayer of the thermal insulating layer using a photolithography technique; and a step S22 of depositing a SiOxNy film on the first thermal insulating sublayer using the PECVD technique, and forming a second thermal insulating sublayer of the thermal insulating layer using the photolithography technique.

11. The method for manufacturing the OLED display panel according to claim 10, wherein a reaction condition in the step S21 of depositing the SiOx film is controlled to have a temperature of 400° C.-440° C., an energy of 10 KW-20 KW, a pressure of 40 Pa-80 Pa, a flow ratio of SiH4:N2O ranging from 1:100 to 1:50, and a reaction time of 20 sec-40 sec; and a reaction condition in the step S22 of depositing the SiOxNy film is controlled to have a temperature of 400° C.-440° C., an energy of 10 KW-20 KW, a pressure of 40 Pa-80 Pa, a flow ratio of SiH4:N2O:NH3 ranging from 1:100:80 to 1:100:120, and a reaction time of 20 sec-40 sec.

12. The OLED display panel according to claim 10, wherein in the second thermal insulating sublayer, oxygen has a quantity greater than that of nitrogen.

13. The method for manufacturing the OLED display panel according to claim 10, wherein the thermal insulating layer has a thickness ranging from 50 micrometers to 100 micrometers.

* * * * *